(12) United States Patent
Xie et al.

(10) Patent No.: US 8,728,908 B2
(45) Date of Patent: May 20, 2014

(54) METHODS OF FORMING A DIELECTRIC CAP LAYER ON A METAL GATE STRUCTURE

(75) Inventors: Ruilong Xie, Albany, NY (US); Chang Seo Park, Clifton Park, NY (US); William James Taylor, III, Clifton Park, NY (US); John Iacoponi, Wappingers Falls, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 381 days.

(21) Appl. No.: 13/205,050

(22) Filed: Aug. 8, 2011

(65) Prior Publication Data

US 2013/0040450 A1    Feb. 14, 2013

(51) Int. Cl.
*H01L 21/76* (2006.01)

(52) U.S. Cl.
USPC .......................................... 438/431; 438/788

(58) Field of Classification Search
USPC ............. 438/308, 400, 402, 431, 788, 795
See application file for complete search history.

(56) References Cited

U.S. PATENT DOCUMENTS

| | | | |
|---|---|---|---|
| 2007/0184656 A1* | 8/2007 | Sherman et al. | 438/687 |
| 2009/0049146 A1* | 2/2009 | Okita et al. | 709/206 |
| 2009/0152629 A1* | 6/2009 | Hu et al. | 257/344 |
| 2011/0062501 A1 | 3/2011 | Soss et al. | |

OTHER PUBLICATIONS

Seo et al., "Full Metal Gate with Borderless Contact for 14 nm and Beyond," IBM Research Alliance Teams.

* cited by examiner

*Primary Examiner* — Hsien Ming Lee
(74) *Attorney, Agent, or Firm* — Amerson Law Firm, PLLC

(57) ABSTRACT

Disclosed herein are various methods of forming metal-containing insulating material regions on a metal layer of a gate structure of a semiconductor device. In one example, the method includes forming a gate structure of a transistor, the gate structure comprising at least a first metal layer, and forming a first metal-containing insulating material region in the first metal layer by performing a gas cluster ion beam process using to implant gas molecules into the first metal layer.

23 Claims, 4 Drawing Sheets

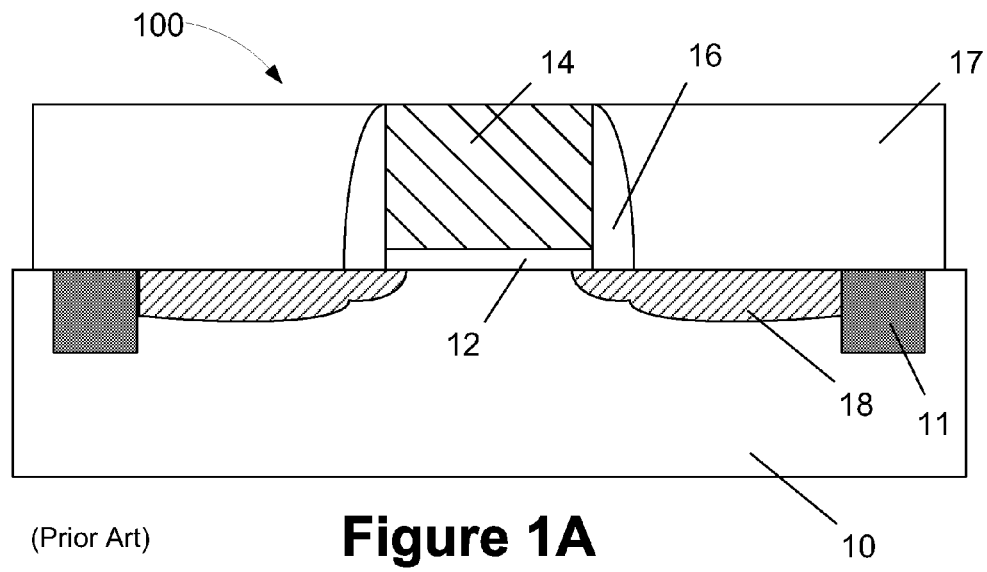
(Prior Art) Figure 1A
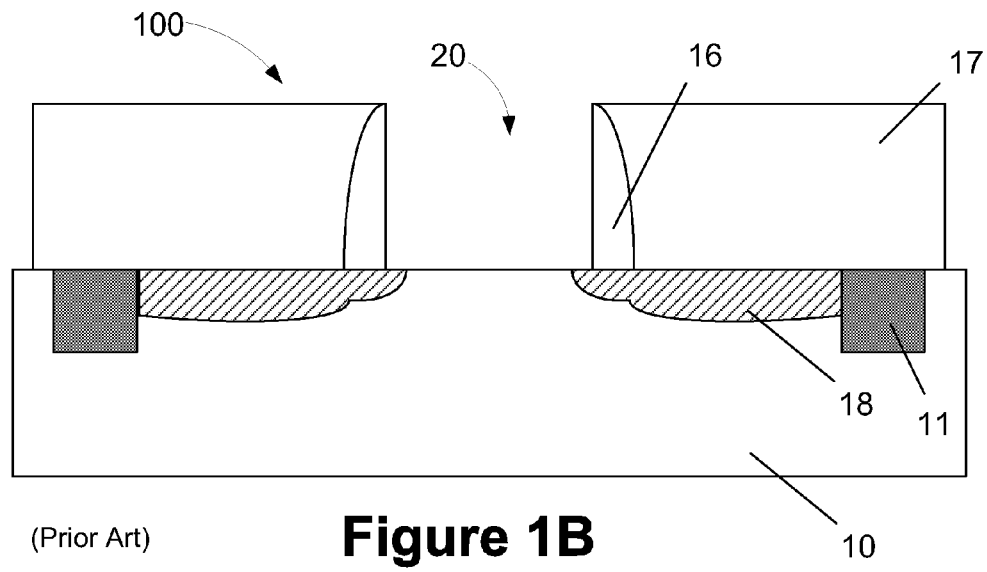
(Prior Art) Figure 1B

METHODS OF FORMING A DIELECTRIC CAP LAYER ON A METAL GATE STRUCTURE

BACKGROUND OF THE INVENTION

1. Field of the Invention

Generally, the present disclosure relates to the manufacturing of sophisticated semiconductor devices, and, more specifically, to various methods of forming a dielectric cap layer on a metal gate structure, such as a replacement gate structure.

2. Description of the Related Art

The fabrication of advanced integrated circuits, such as CPUs, storage devices, ASICs (application specific integrated circuits) and the like, requires the formation of a large number of circuit elements in a given chip area according to a specified circuit layout, wherein field effect transistors (NMOS and PMOS transistors) represent one important type of circuit elements that substantially determine performance of the integrated circuits. During the fabrication of complex integrated circuits using, for instance, MOS technology, millions of transistors, e.g., NMOS transistors and/or PMOS transistors, are formed on a substrate including a crystalline semiconductor layer. A field effect transistor, irrespective of whether an NMOS transistor or a PMOS transistor is considered, typically comprises so-called PN junctions that are formed by an interface of highly doped regions, referred to as drain and source regions, with a slightly doped or non-doped region, such as a channel region, disposed between the highly doped regions source/drain regions.

In a field effect transistor, the conductivity of the channel region, i.e., the drive current capability of the conductive channel, is controlled by a gate electrode formed adjacent to the channel region and separated therefrom by a thin gate insulation layer. The conductivity of the channel region, upon formation of a conductive channel due to the application of an appropriate control voltage to the gate electrode, depends upon, among other things, the dopant concentration, the mobility of the charge carriers and, for a given extension of the channel region in the transistor width direction, the distance between the source and drain regions, which is also referred to as the channel length of the transistor. Hence, in combination with the capability of rapidly creating a conductive channel below the insulating layer upon application of the control voltage to the gate electrode, the conductivity of the channel region substantially affects the performance of MOS transistors. Thus, since the speed of creating the channel, which depends in part on the conductivity of the gate electrode, and the channel resistivity substantially determine the characteristics of the transistor, the scaling of the channel length, and associated therewith the reduction of channel resistivity and the increase of gate resistivity, are dominant design efforts used to increase the operating speed of the integrated circuits.

For many early device technology generations, the gate electrode structures of most transistor elements has comprised a plurality of silicon-based materials, such as a silicon dioxide and/or silicon oxynitride gate insulation layer, in combination with a polysilicon gate electrode. However, as the channel length of aggressively scaled transistor elements has become increasingly smaller, many newer generation devices employ gate electrode stacks comprising alternative materials in an effort to avoid the short-channel effects which may be associated with the use of traditional silicon-based materials in reduced channel length transistors. For example, in some aggressively scaled transistor elements, which may have channel lengths of on the order of approximately 14-32 nm, gate electrode stacks comprising a so-called high-k dielectric/metal gate (HK/MG) configuration have been shown to provide significantly enhanced operational characteristics over the heretofore more commonly used silicon dioxide/polysilicon (SiO/poly) configurations.

Depending on the specific overall device requirements, several different high-k materials—i.e., materials having a dielectric constant, or k-value, of approximately 10 or greater—have been used with varying degrees of success for the gate insulation layer in a HK/MG gate electrode structure. For example, in some transistor element designs, a high-k gate insulation layer may include tantalum oxide ($Ta_2O_5$), hafnium oxide ($HfO_2$), zirconium oxide ($ZrO_2$), titanium oxide ($TiO_2$), aluminum oxide ($Al_2O_3$), hafnium silicates ($HfSiO_x$), and the like. Furthermore, one or more non-polysilicon metal gate electrode materials—i.e., a metal gate stack—may be used in HK/MG configurations so as to control the work function of the transistor. These metal gate electrode materials may include, for example, one or more layers of titanium (Ti), titanium nitride (TiN), titanium-aluminum (TiAl), aluminum (Al), aluminum nitride (AlN), tantalum (Ta), tantalum nitride (TaN), tantalum carbide (TaC), tantalum carbonitride (TaCN), tantalum silicon nitride (TaSiN), tantalum silicide (TaSi), and the like.

One well-known processing method that has been used for forming a transistor with a high-k/metal gate structure is the so-called "gate last" or "replacement gate" technique. FIGS. 1A-1D depict one illustrative prior art method for forming an HK/MG replacement gate structure using a gate-last technique. As shown in FIG. 1A, the process includes the formation of a basic transistor structure 100 above a semiconducting substrate 10 in an active area defined by a shallow trench isolation structure 11. At the point of fabrication depicted in FIG. 1A, the device 100 includes a sacrificial gate insulation layer 12, a dummy or sacrificial gate electrode 14, sidewall spacers 16, a layer of insulating material 17 and source/drain regions 18 formed in the substrate 10. The various components and structures of the device 100 may be formed using a variety of different materials and by performing a variety of known techniques. For example, the sacrificial gate insulation layer 12 may be comprised of silicon dioxide, the sacrificial gate electrode 14 may be comprised of polysilicon, the sidewall spacers 16 may be comprised of silicon nitride and the layer of insulating material 17 may be comprised of silicon dioxide. The source/drain regions 18 may be comprised of implanted dopant materials (N-type dopants for NMOS devices and P-type dopant for PMOS devices) that are implanted into the substrate using known masking and ion implantation techniques. Of course, those skilled in the art will recognize that there are other features of the transistor 100 that are not depicted in the drawings for purposes of clarity. For example, so called halo implant regions are not depicted in the drawings as well as various layers or regions of silicon germanium that are typically found in high-performance PMOS transistors. At the point of fabrication depicted in FIG. 1A, the various structures of the device 100 have been formed and a chemical mechanical polishing process (CMP) has been performed to remove any materials above the sacrificial gate electrode 14 (such as a protective cap layer (not shown) comprised of silicon nitride) so that the sacrificial gate electrode 14 may be removed.

As shown in FIG. 1B, one or more etching processes are performed to remove the sacrificial gate electrode 14 and the sacrificial gate insulation layer 12 to thereby define a gate opening 20 where a replacement gate structure will subsequently be formed. A masking layer that is typically used in such etching processes is not depicted for purposes of clarity.

Typically, the sacrificial gate insulation layer 12 is removed as part of the replacement gate technique, as depicted herein. However, the sacrificial gate insulation layer 12 may not be removed in all applications.

Next, as shown in FIG. 1C, various layers of material that will constitute a replacement gate structure 30 are formed in the gate opening 20. In one illustrative example, the replacement gate structure 30 is comprised of a high-k gate insulation layer 30A having a thickness of approximately 2 nm, a work-function adjusting layer 30B comprised of a metal (e.g., a layer of titanium nitride with a thickness of 2-5 nm) and a bulk metal layer 30C (e.g., aluminum). Ultimately, as shown in FIG. 1D, a CMP process is performed to remove excess portions of the gate insulation layer 30A, the work-function adjusting layer 30B and the bulk metal layer 30C positioned outside of the gate opening 20 to define the replacement gate structure 30.

One important aspect of the replacement gate technique involves the formation of a protective dielectric layer (not shown) above the replacement gate structure 30. Such a protective layer acts to protect the replacement gate structure 30 in subsequent processing operations, such as the various process operations performed to form conductive contacts to the source/drain regions 18. Protection of the replacement gate structure 30 is even more important as device dimensions continue to shrink and the use of self-aligned contact formation techniques. One technique that has been employed in the past is to simply form another layer of material above the replacement gate electrode using known deposition techniques. However, such techniques involve performing a number of time-consuming processing operations and perhaps require hard-masking and patterning which is not feasible with current lithographic alignment capabilities. More recently, efforts have been made to form such a protective layer have included oxidizing, nitriding or fluorinating the metal portions of the replacement gate structure 30. See, for example, U.S. Patent Publication 2011/0062501. However, as the gate length of the device 100 is scaled, the proportion of the work function adjusting layer 30B becomes much greater as compared to the other layers that make up the replacement gate structure 30. Forming the metal-containing insulating material by oxidation or nitridation of such a work function adjusting layer 30B comprised of, for example, titanium nitride or tantalum nitride, has proven to be difficult. Additionally, there is often a stringent constraint on the allowable temperature of the oxidation or nitridation process, which tends to make the oxidation or nitridation of metals more difficult. With fluorination it is very difficult to form a sufficiently thick oxide cap layer to protect the underlying replacement gate structure 30.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming a dielectric cap layer on a metal gate structure, such as a replacement gate structure. In one example, the method includes forming a gate structure of a transistor, the gate structure comprising at least a first metal layer, and forming a first metal-containing insulating material region in the first metal layer by performing a gas cluster ion beam process. In some application, where oxygen is used during the gas cluster ion beam process, the first metal-containing insulating material region may be a metal oxide.

In another illustrative example, the method includes forming a gate structure that includes a first metal layer and a second metal layer, and forming a first metal-containing insulating material region in the first metal layer and a second metal-containing insulating material region in the second metal layer by performing at least one gas cluster ion beam process to direct gas molecules toward the first and second metal layers. In some applications, one or both of the first and second metal-containing insulating material regions may be either a metal oxide or a metal nitride, e.g., when the gas cluster ion beam process is performed using oxygen or nitrogen, respectively.

In yet another illustrative example, the method includes forming a replacement gate structure comprised of a high-k gate insulation layer, a first metal layer and a second metal layer, and forming a first metal oxide region having a thickness of at least 0.5 nm in the first metal layer and a second metal oxide region having a thickness of at least 0.5 nm in the second metal layer by performing a gas cluster ion beam process to direct oxygen molecules toward the first and second metal layers. In this illustrative example, the gas cluster ion beam process is performed at a temperature of less than 400° C. and at an energy level ranging of at least 3 keV.

In another example, a device is disclosed herein that includes a gate structure of a transistor that includes at least a first metal layer and a first metal-containing insulating material region positioned on an upper end of the first metal layer. In yet another example, a device disclosed herein includes a gate structure that includes at least a first metal layer and a second metal layer, a first metal-containing insulating material region positioned on an upper end of the first metal layer and a second metal-containing insulating material region positioned on an upper end of the second metal layer.

BRIEF DESCRIPTION OF THE DRAWINGS

The disclosure may be understood by reference to the following description taken in conjunction with the accompanying drawings, in which like reference numerals identify like elements, and in which:

FIGS. 1A-1D depict one illustrative prior art process flow for forming a semiconductor device using a gate last approach.

Figure 1C:
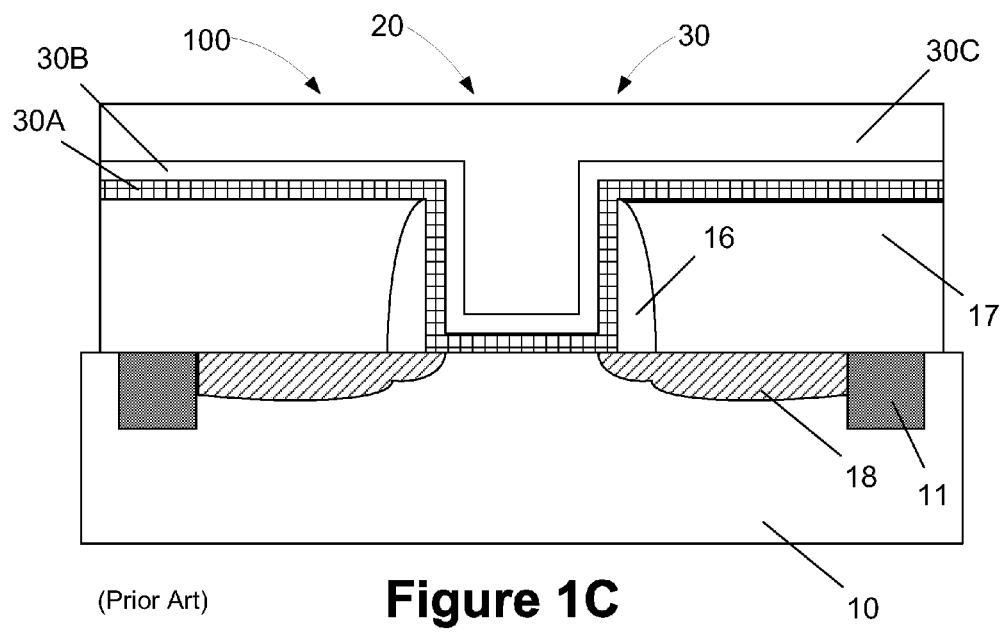

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming a dielectric cap layer on a metal gate structure. As will be readily apparent to those skilled in the art upon a complete reading of the present application, the present method is applicable to a variety of technologies, e.g., NMOS, PMOS, CMOS, etc., and is readily applicable to a variety of devices, including, but not limited to, logic devices, memory devices, etc. With reference to FIGS. 2A-2D, various illustrative embodiments of the methods disclosed herein will now be described in more detail.

Figure 2A:
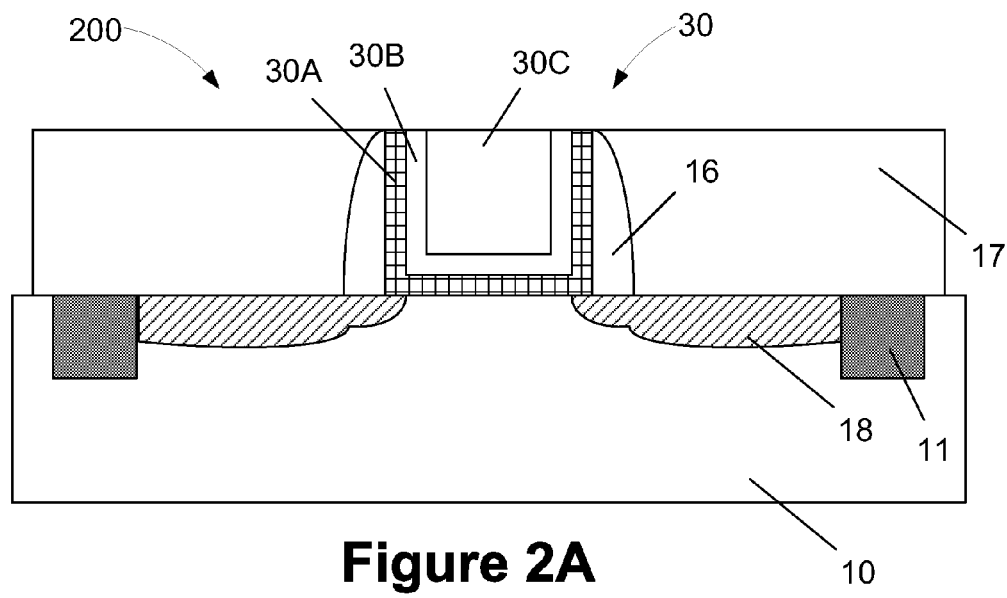
FIGS. 2A-2D depict one various illustrative examples of using the methods disclosed herein to form metal oxide regions on the metal layer(s) of a gate structure of a semiconductor device.

FIG. 2A is a simplified view of an illustrative semiconductor device 200 at an early stage of manufacturing that is formed above a semiconducting substrate 10. At the point of fabrication depicted in FIG. 2A, the device 200 includes a replacement gate structure 30, sidewall spacers 16, a layer of insulating material 17 and source/drain regions 18 formed in the substrate 10. The substrate 10 may have a variety of configurations, such as the depicted bulk silicon configuration. The substrate 10 may also have a silicon-on-insulator (SOI) configuration that includes a bulk silicon layer, a buried insulation layer and an active layer, wherein semiconductor devices are formed in and above the active layer. Thus, the terms substrate or semiconductor substrate should be understood to cover all forms of semiconductor structures. The substrate 10 may also be made of materials other than silicon.

Figure 1D:
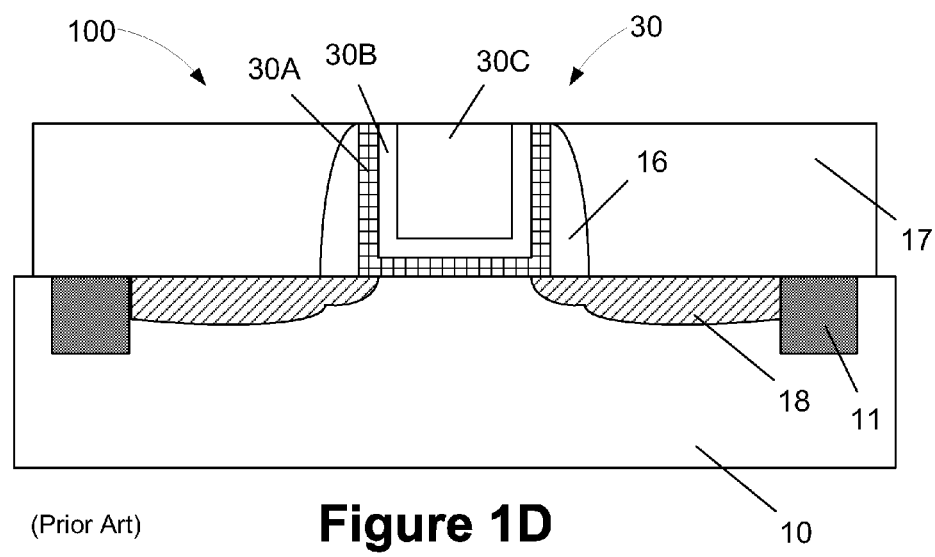

In general, the present disclosure is directed to converting portions of the exposed metal layer(s) of a gate electrode structure of a semiconductor device into regions of metal-containing insulating material by performing a gas cluster ion beam (GCIB) process using gas molecules, such as, for example, oxygen. In the illustrative embodiment depicted herein, the replacement gate structure 30 is comprised of a high-k gate insulation layer 30A, a first metal layer 30B comprised of a metal, typically a work-function adjusting metal (e.g., a layer of titanium nitride) and a second metal layer 30C (e.g., aluminum). In general, in FIG. 2A, the device 200 is depicted at the point of fabrication that corresponds to that depicted in FIG. 1D for the device 100. Thus, the discussion about illustrative materials and methods of manufacture employed in making the device 100 apply equally to the device 200 up to this point of fabrication. Of course, to the extent that like numbers of various components are used, the previous discussion of those components in connection with the device 100 apply equally as well to the device 200.

As will be recognized by those skilled in the art after a complete reading of the present application, the replacement gate structure 30 may be of any desired construction and comprised of any of a variety of different materials. For example, the replacement gate structure 30 may have more metal layers than the two illustrative metal layers depicted in FIG. 2A. The metal layer(s) in the replacement gate structure may be made from many different metals in addition to those identified above, such as lanthanum, tantalum, tantalum nitride, titanium, titanium nitride, etc. Additionally, the replacement gate structure 30 for a NMOS device may have different material combinations as compared to a replacement gate structure 30 for a PMOS device. Thus, the particular details of construction of replacement gate structure 30, and the manner in which such replacement gate electrode structure 30 is formed, should not be considered a limitation of the present invention. Moreover, the present disclosure is not limited to the illustrative example wherein the gate structure on a semiconductor device is a replacement gate structure 30. Rather, the present disclosure may be employed to form metal oxide regions on any type of gate structure that includes at least one metal layer as part of the gate structure, and the methods disclosed herein may be employed on gate structures that do not employ a high-k gate insulation layer.

The substrate 10 may have a variety of configurations, such as the depicted bulk silicon configuration. The substrate 10 may also have a silicon-on-insulator (SOI) configuration that includes a bulk silicon layer, a buried insulation layer and an active layer, wherein semiconductor devices are formed in and above the active layer. Thus, the terms substrate or semiconductor substrate should be understood to cover all forms of semiconductor structures. The substrate 10 may also be made of materials other than silicon.

Figure 2B:
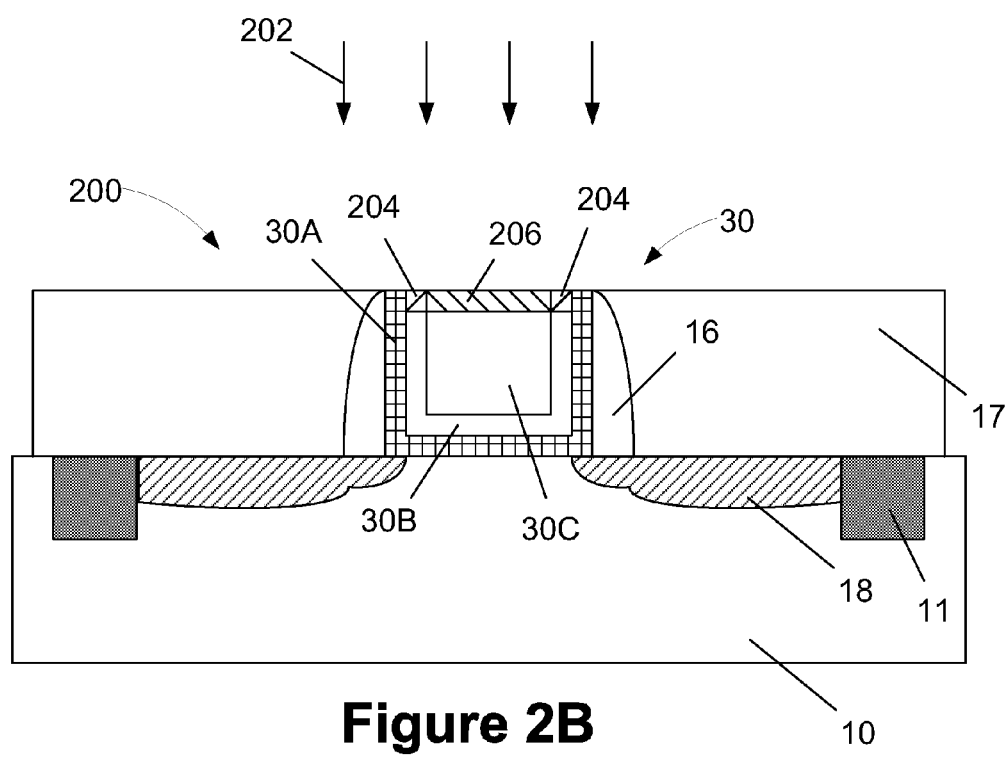
Figure 2C:
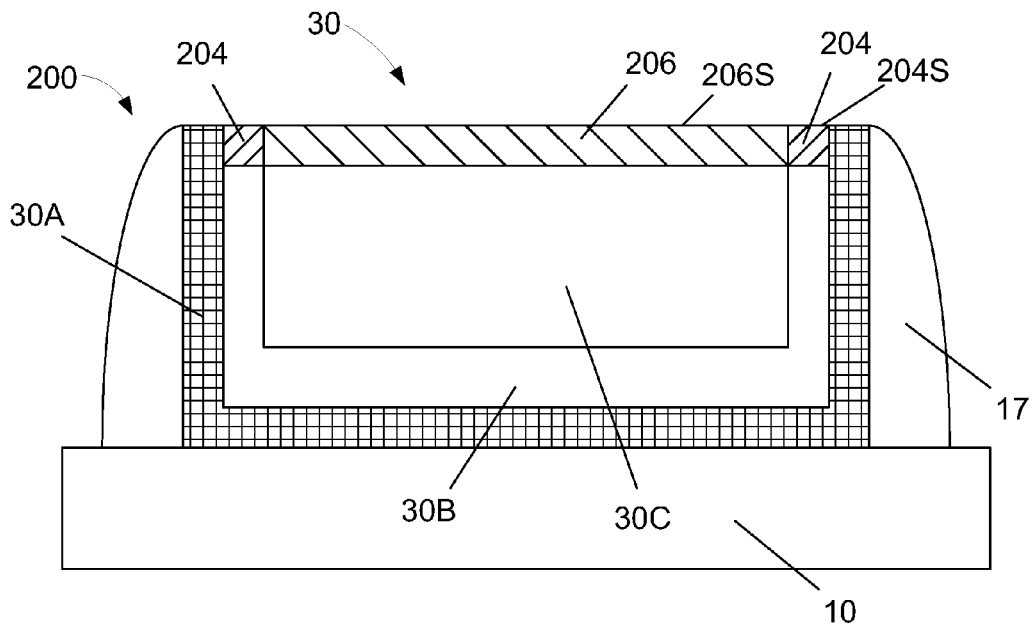

Next, as shown in FIG. 2B, a gas cluster ion beam (GCIB) process 202 is performed on the exposed first and second metal layers 30B, 30C, respectively, to form a first metal-containing insulating material region 204 on the first metal layer 30B and a second metal-containing insulating material region 206 on the second metal layer 30C. FIG. 2C is an enlarged version of the replacement gate structure 30 that is provided for clarity. The GCIB process 202 may be performed with (a masked process) or without (a blanket process) a masking layer, e.g., a photoresist mask or a hard mask, however, so as not to obscure the present invention, such a masking layer is not depicted in the drawings. It should also be noted that there may be a very thin metal oxide region (not shown) formed on one or both of the first and second metal layers 30B, 30C as a result of the CMP process and/or due to exposure to an ambient comprising oxygen.

The first and second metal-containing insulating material regions 204, 206 may be made of the same or different metal-containing compounds, depending upon the materials of the first and second metal layers 30B, 30C and the type of gas molecule implanted during the GCIB process 202. As used herein, the phrase "metal-containing insulating material region" shall be understood to be a dielectric material that is a metal compound that has a k value between 3-100. In some applications, one or both of the first and second insulating regions 204, 206 may be either a metal oxide or a metal nitride composition formed when the GCIB process 202 is performed with oxygen or nitrogen, respectively. By way of example, in terms of metal oxides, one or both of the first and second insulating regions 204, 206 may be aluminum oxide, nickel oxide, copper oxide, titanium oxide, titanium oxynitride, tantalum oxide, tantalum oxynitride, etc. Moreover, the first and second insulation material regions 204, 206 may or may not have the same thickness or depth. For example, in one illustrative embodiment, where the second metal-containing insulating material region 206 is an aluminum oxide, it may have a thickness (measured downward from the top surface 206S) ranging from approximately 2-20 nm, depending upon the parameters of the GCIB process 202. In some cases, depending on the particular metal oxide that is formed, the thickness may range from at least about 0.5-20 nm or more.

In the GCIB process 202 ionized gas atoms, such as ionized oxygen atoms, are energized and directed to the exposed metal portions of the illustrative replacement gate structure 30. Depending upon the application, and the desired thickness of the resulting metal-containing insulating material region(s), the GCIB process 202 may be performed at an energy level ranging from approximately 3-60 keV and it may be performed at a relatively low temperature, e.g., less than 400° C. In other cases, the energy level may range from at least 3 keV to tens or hundreds of keV. In one illustrative example, a dose of gas molecules of approximately 10,000 oxygen molecules per cluster is used in performing the a GCIB process 202 with gas cluster size of a few nanometers in diameter, which, in some cases, translates to an energy level of about 1-6 eV/molecule. This relatively low level of energy per molecule results in relative shallow penetration which, in turn, produces a higher concentration of energy in a relatively small impact volume. In some cases, the GCIB process 202 results highly local impact temperature peaks that may be greater than 10,000 degree for extremely brief periods of time such as for less than 10 picoseconds. Moreover, during the GCIB process 202, the bulk of the substrate and surround structures remains at a relatively low temperature, e.g., around 25 C., due to the highly localized nature of the GCIB process 202. The overall duration of the GCIB process 202 may vary depending upon the particular application and the desired results, but, in general, the GCIB process 202 may be performed for a duration of approximately 3-8 minutes. The GCIB process 202 may be performed using a variety of gases, such as oxygen, fluorine, nitrogen, etc. or combinations of a variety of different gases, depending upon the particular application.

Figure 2D:
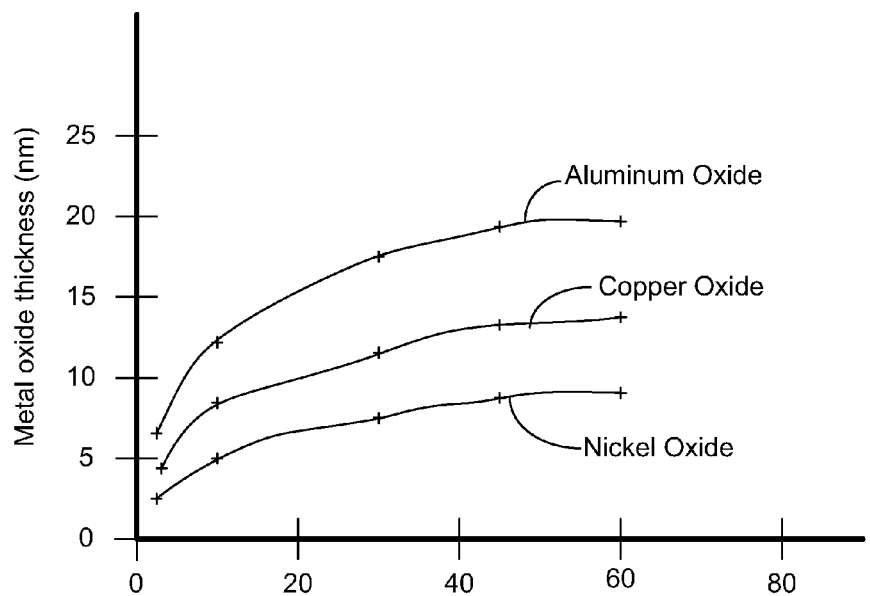

FIG. 2D is a chart depicting the thickness achieved when using a GCIB process using oxygen is performed to form different types of illustrative metal oxide regions. The vertical axis represents the final thickness of the resulting metal oxide region while the horizontal axis reflects the energy applied in the GCIB process. The chart depicts the thickness of the metal oxide region for three different types of metal oxides—aluminum oxide, copper oxide and nickel oxide—based upon various conditions of the GCIB process 202. As can be seen in FIG. 2D, of the three depicted metal oxides, all other things being equal, the thickness of the resulting metal oxide region is greatest for aluminum oxide (maximum thickness of about 20 nm with an energy level of about 60 keV), whereas the thinnest metal oxide region is formed when forming a nickel oxide region (maximum thickness of about 8 nm with an energy level of about 60 keV) with copper oxide (maximum thickness of about 12 nm an energy level of about 60 keV) falling between the other two.

The metal-containing insulating material regions 204, 206 formed using the methods disclosed herein are of sufficient thickness to protect the underlying metal materials of gate structure from attack during further processing operations. Such additional processing operations may include the formation of metal silicide regions (not shown) on the source/drain regions 18, the formation of self-aligned contacts (not shown) that are conductively coupled to the metal silicide regions, and the formation of additional metallization layers (not shown) above the device 200 using known techniques. Of course, the total number of metallization layers may vary depending on the particular device under construction.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a replacement gate structure of a transistor, said replacement gate structure comprising at least a first metal layer, wherein forming said replacement gate structure comprises removing at least a sacrificial gate electrode and forming said replacement gate structure comprised of said first metal layer and a high-k gate insulation layer; and
    forming a first metal-containing insulating material region in said first metal layer by performing a gas cluster ion beam process.

2. The method of claim 1, wherein performing said gas cluster ion beam process comprises performing said gas cluster ion beam process at a temperature of less than 400° C.

3. The method of claim 2, further comprising performing said gas cluster ion beam process for a duration of approximately 3-8 minutes.

4. The method of claim 1, wherein performing said gas cluster ion beam process comprises performing said gas cluster ion beam process using oxygen molecules and wherein said first metal-containing insulating material is a metal oxide.

5. The method of claim 1, wherein performing said gas cluster ion beam process comprises performing said gas cluster process at an energy level of at least 3 keV.

6. The method of claim 1, wherein performing said gas cluster ion beam process comprises performing said gas cluster ion beam process at a dose of approximately 10,000 gas molecules per cluster.

7. The method of claim 1, wherein said first metal-containing insulating material region has a thickness of at least 0.5 nm.

8. The method of claim 1, wherein performing said gas cluster ion beam process comprises performing said gas cluster ion beam process using at least one of oxygen, nitrogen and fluorine gas.

9. A method, comprising:
    forming a gate structure comprised of a first metal layer and a second metal layer; and forming a first metal-containing insulating material region in said first metal layer and a second metal-containing insulating material region in said second metal layer by performing at least one gas cluster ion beam process to direct gas molecules toward said first and second metal layers.

10. The method of claim 9, wherein said gate structure is a replacement gate structure, said first metal layer is a work-function adjusting metal layer, and said second layer is a metal fill layer.

11. The method of claim 9, wherein said first metal layer is titanium nitride, said second metal layer is aluminum, said first metal-containing insulating material region is a titanium oxide and said second metal-containing insulating material region is an aluminum oxide.

12. The method of claim 9, wherein said first and second metal-containing insulating material regions are comprised of the same material.

13. The method of claim 9, wherein said first and second metal-containing insulating material regions are comprised of different materials.

14. The method of claim 9, wherein said first and second metal-containing insulating material regions have different thicknesses.

15. The method of claim 9, wherein performing said gas cluster ion beam process comprises performing said gas cluster ion beam process at a temperature of less than 400° C.

16. The method of claim 15, further comprising performing said gas cluster ion beam process for a duration of 3-8 minutes.

17. The method of claim 15, wherein performing said gas cluster ion beam process comprises performing said gas cluster process at an energy level of at least 3 keV.

18. The method of claim 9, wherein said first and second metal-containing insulating material regions are metal oxide regions and wherein said at least one gas cluster ion beam process is performed to direct oxygen molecules toward said first and second metal layers.

19. The method of claim 18, wherein performing said gas cluster ion beam process comprises performing said gas cluster ion beam process using oxygen at a dose of approximately 10,000 oxygen molecules per cluster.

20. A method, comprising:
forming a replacement gate structure comprised of a high-k gate insulation layer, a first metal layer and a second metal layer; and
forming a first metal oxide region having a thickness of at least 0.5 nm in said first metal layer and a second metal oxide region having a thickness of at least 0.5 nm in said second metal layer by performing at least one gas cluster ion beam process to direct oxygen molecules toward said first and second metal layers, wherein said gas cluster ion beam process is performed at a temperature of less than 400° C. and at an energy level of at least 3 keV.

21. The method of claim 20, wherein said first and second metal oxide regions are comprised of the same metal oxide.

22. The method of claim 20, wherein said first and second metal oxide regions are comprised of different metal oxides.

23. The method of claim 20, wherein said first and second metal oxide regions have different thicknesses.

* * * * *